United States Patent [19]

Khoury et al.

[11] 3,729,966

[45] May 1, 1973

[54] APPARATUS FOR CONTOURING THE SURFACE OF THIN ELEMENTS

[75] Inventors: Henri A. Khoury, Yorktown Heights; Hans R. Rottmann, Poughkeepsie, both of N.Y.

[73] Assignee: International Business Machines Corporation, Armonk, N.Y.

[22] Filed: Feb. 2, 1972

[21] Appl. No.: 223,681

[52] U.S. Cl. ..........................72/12, 29/569, 72/54, 264/40, 264/DIG. 78, 425/141

[51] Int. Cl. ..........................B21d 26/00

[58] Field of Search..........................72/8, 9, 12, 31, 72/54, 57, 385; 29/569, 421; 73/37, 49.8; 264/88, 89, 90, 40, DIG. 78; 156/585; 425/141, 150, 388

[56] References Cited

UNITED STATES PATENTS

| | | | |
|---|---|---|---|
| 3,180,011 | 4/1965 | Heuer | 29/421 |
| 3,244,779 | 4/1966 | Levey et al. | 425/388 |
| 3,487,133 | 12/1969 | Lindsay | 264/40 |
| 3,496,744 | 2/1970 | Mizuno | 72/12 |
| 3,599,288 | 8/1971 | Eakman | 264/40 |
| 3,640,660 | 2/1972 | De Mets | 425/121 |

*Primary Examiner*—Richard J. Herbst
*Attorney*—William J. Dick et al.

[57] ABSTRACT

Apparatus and a method for contouring the surface of a thin element such as a semiconductor wafer, the apparatus including a plurality of individual reciprocatable suction cups for grasping at selected places the lower surface of the wafer. Superimposed of the wafer is a plurality of sensors for directing air against the opposite surface of the wafer and which senses, by back pressure, the distance from the terminal end of the sensor to the wafer thereby sensing the contour of the surface of the wafer. Each sensor is connected to a comparitor which responds to its associated sensor to actuate through a stepping motor and cam the individual reciprocatable suction cups to elevate or retract the same when the comparitor indicates a difference between the desired contour at that particular place on the surface and the actual contour of the wafer.

20 Claims, 6 Drawing Figures

APPARATUS FOR CONTOURING THE SURFACE OF THIN ELEMENTS

SUMMARY OF THE INVENTION AND STATE OF THE PRIOR ART

The present invention relates to a method of and apparatus for contouring the surface of a thin element, and more particularly relates to apparatus for contouring the surface of a semiconductor wafer.

In order to manufacture integrated circuits it is conventional to deposit a layer of photoresist on top of a semiconductor wafer (the wafer usually being disc-shaped but may be rectangular, oval, etc.) and then expose the pattern through a mask onto the photoresist. To the naked eye the polished wafer appears to be extremely smooth and flat, but in fact the waviness of the wafer's surface oft times approaches 200 micro-inches. Additionally the wafer may be bowed by as much as 0.02 – 0.04 inches. Because of the above, it has been conventional practice to place the semiconductor wafer into direct contact with the mask and even to apply pressure between the two in order to achieve coplanarity. This is necessary to prevent exposure distortion of the lines on the wafer (and of course the chips) and thereby to reduce waste caused by bad products.

However, the pattern on the mask (the mask usually being made of glass with a metalized pattern on one surface thereof) when placed against the wafer causes damage to the patterns which shortens the mask life. The unevenness in the topography of the wafer can and does result in distortion and therefore waste in the final product even when utilizing projection printing wherein the mask does not contact the wafer.

Many means have been utilized in the past to insure flatness of plates. The techniques utilized in metal treating including stamping and annealing, as well as heat treating operations are well-known in the art. Photographic plates which are utilized in the testing of air survey cameras require flat plates within 1 or 2 microns. In an article "Control and Interferometric Measurement of Plate Flatness," Journal of the Optical Society of America, Volume 45, Number 12, Dec., 1955, Page 1009, a means for flattening ¼ inch plate glass supporting a photographic emulsion is illustrated. The article describes determining the flatness of the plate by utilizing an interferometer using infrared light, the plate then being flexed by controlled bending and by individually adjusting screws attached to a plurality of suction cups on the opposite side of the plate. The adjustment is then carried out by hand. However, this method of controlling glass flatness has its disadvantages in that it is time consuming and the adjustment must be made by hand.

In view of the above it is a principal object of the present invention to provide a method of an d apparatus for automatically contouring the surface of thin elements, such as semiconductor wafers.

Another object of the present invention is to provide a method of, and apparatus for, contouring one surface of a semiconductor wafer by operating upon the opposite surface of the wafer and without contact with the surface to be contoured.

Another object of the present invention is to provide a method of and apparatus for contouring a wafer so as to achieve and compensate for aberrations in lenses used in projection printing.

Yet another object of the present invention is to provide simple apparatus which is easy to maintain and simple to set up so as to achieve the desired flatness specification within a limited period of time.

Yet another object of the present invention is to provide apparatus for contouring a semiconductor wafer which reproduces the contour desired to within very small tolerances.

Other objects and more complete understanding of the invention may be had by referring to the following specification and claims taken in conjunction with the accompanying drawings in which:

Figure 1:
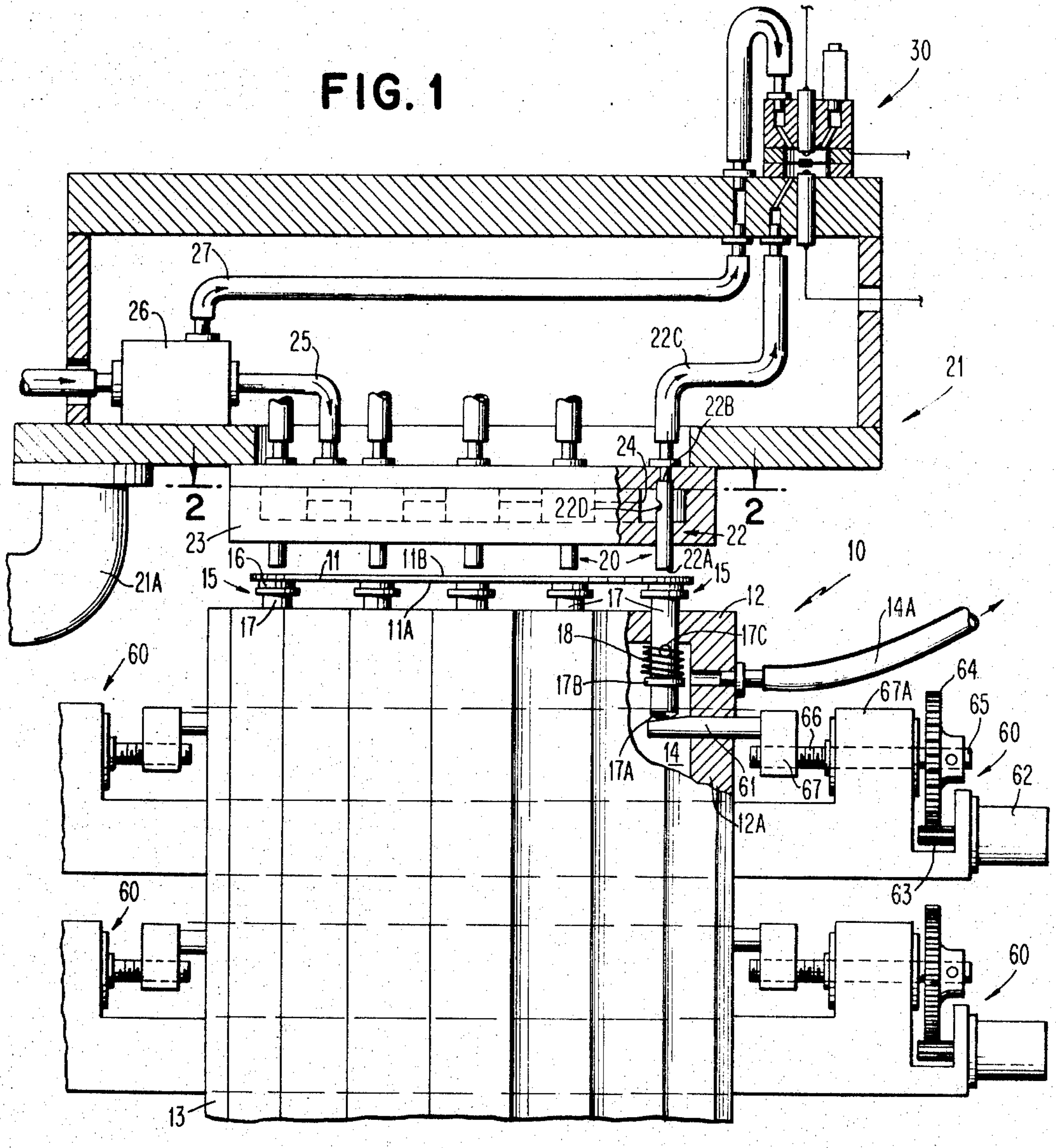
FIG. 1 is a fragmentary side elevational view, partly in schematic, illustrating the novel apparatus for carrying out the method of the present invention.

Referring now to the drawings, and especially FIG. 1 thereof, apparatus 10 for contouring a surface of a thin element, such as a semiconductor wafer 11 is illustrated therein. Throughout the following description it should be understood that by wafer is meant a thin element of any geometrical configuration having a surface which is to be contoured.

In accordance with the invention, the apparatus comprises a plurality of individual wafer retaining means 15 for grasping, at selected places, a surface 11A of the wafer 11. Facing the opposite surface 11B of the wafer but spaced therefrom is a plurality of sensing means 20 for sensing the contour or topography of the surface 11B of the wafer. Comparing means 30 are connected to the sensing means and are responsive thereto for comparing a desired contour or topography of the surface 11B of the water 11 with the actual contour of the surface 11B. As more fully set forth hereinafter, each of the sensing means is connected through an associated comparing means 30 to means for manipulating the surface 11A of the wafer 11. Each of the comparing means 30 is connected to actuator means 60 for elevating the retracting individual wafer retaining means 15 when the comparing means indicates a difference between the desired contour and the actual contour of the wafer surface 11B.

Figure 2:
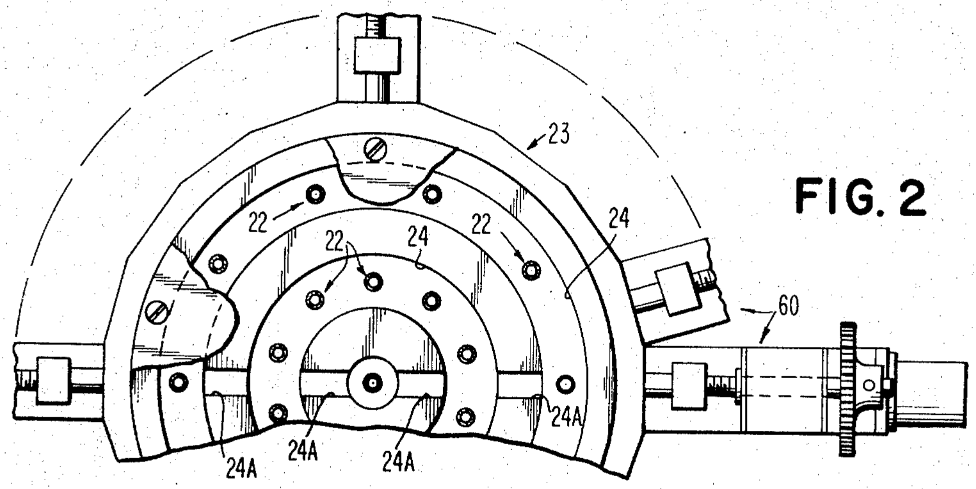
FIG. 2 is a fragmentary sectional view taken along line 2—2 of FIG. 1.

In accordance with the invention, the wafer retaining means 15 grasp one side or surface 11A of the wafer at individual places therealong to individually elevate or retract at localized places thereon by forcible distortion, the opposite surface 11B of the wafer thereby achieving a desired contour in response to the sensing and comparing means. To this end, and referring to FIGS. 1 and 2, each of the wafer retaining means 15 includes an annular suction disc 16 mounted on a reciprocable pedestal or post 17, in the illustrated instance a tubular shaft which extends through the upper surface 12 of a housing 13, the shafts or pedestals 17 extending into the housing 13 and terminating in a chamber 14 therein. As shown, one end 17A of each pedestal or shaft 17 includes a rounded camming surface, and a ridge or flange 17B acts as a stop for a biasing spring 18 which is captured intermediate the flange 17B and the interior of the upper surface 12 of the housing 13. As shown, the biasing spring 18 tends to move the pedestal or shaft 17 downwardly to engage a ramp on a sword cam 61, extending through the sidewall 12A of the housing 13, and associated with the actuator means 60, described hereinafter.

In order to keep or maintain the retaining means in intimate contact with selected portions of the lower surface 11A of the wafer 11, the discs 16 include at least a central aperture (not shown) in fluid communication with the interior of the tubular shaft 17, each of the shafts 17 including an aperture 17C therein which is in communication with the chamber 14 of the housing 13. In this manner, a vacuum may be drawn, as through vacuum hose 14A, thereby effecting a gripping action by the retaining means against the surface 11A of the wafer.

With the wafer 11 in place and being firmly held by the suction cup 16 associated with the individual pedestal 17, a head 21 mounted, for example, on a pivot arm 21A is rotated in a horizontal plane about a vertical axis until the sensing means are superimposed of the surface 11B of the wafer 11. Thereafter the sensing means senses the topography of the surface 11B of the wafer 11. To this end, each of the sensing means 20, in the illustrated instance, comprises a small diameter tube 22 having open terminal ends 22A and 22B respectively, the upper end 22B being connected through suitable tubing 22C to its individual and associated comparing means 30 (only one of which is depicted in FIG. 1). Each of the tubes 22 is nested in a channeled manifold 23 having a plurality of chambers 24 therein which are in fluid communication with an air inlet line 25 which is connected to an air distribution manifold 26. Each of the chambers 24 are of annular construction and are in communication with each other as by radially extending ports and the like 24A. In a like manner, each of the tubes 22 is in communication with the chamber 24 through inlet apertures 22D in the side wall of the tube to thereby permit air to flow from the distribution manifold 26 into the tubes 22 by way of the chambers 24, and thus to permit air to egress from the ends 22A and 22B of the tube 22.

The amount of pressure in the tube 22C associated with a particular sensor is directly related to the volume of flow escaping from the open end 22A of the tube 22, and therefore a measure of the proximity of the wafer 11 to the end of the tube. In order to measure the distance from the end 22A of the tube 22 to the surface of the wafer at its particular location, the comparing means 30 compares the pressure to the fixed pressure emanating from the distribution manifold 26, and sends out a signal to adjust the actuator means to move that portion of the wafer into its predetermined and proper placement, i.e. a predetermined distance from the end of the tube 22. To this end, and referring first to FIG. 3, in the illustrated instance the comparing means comprises a body 31 having an upper portion 32 and a lower portion 33. Intermediate the upper and lower body portions is a chamber 34 including a diaphragm 35 dividing the chamber 34 into an upper chamber portion 34A and a lower chamber portion 34B. As illustrated, the diaphragm has mounted thereon an upper contact 36 and a lower contact 37, each of the contacts being connected as by wires 36A, 37A to conductive shim stock 38 which is connected as at 39 to a power source, hereinafter described. As is evident from the drawing, the shim stock also serves to clamp the edges of the diaphragm and seal the upper chamber portion 34A from the lower chamber portion 34B. Above and below the diaphragm 35 and spaced from the contacts 36 and 37, are adjustable contacts 40 and 41 respectively, the contact connections being screwed respectively into the upper and lower body portions 32 and 33 so that accurate adjustment or spacing of the individual contacts 40A and 41A may be made relative to their associated contacts 36 and 37 mounted on opposite sides of the diaphragm 35.

In order to compare the distance from the end of the tube 22 to the surface 11B of the wafer 11, with a predetermined and desired distance, i.e., wafer contour, the lower chamber portion 34A of the diaphragm is in communication via a conduit 42 with the tube 22C connected to the end 22B of the tube 22; in a like manner, the upper chamber 34A, through a suitable conduit 43, is connected through a tube 27 to the air distribution manifold 26. In order to present the comparing means so that when the end 22A of the tube is a predetermined and desired distance from the upper surface 11B of the wafer 11 the diaphragm will be in its neutral position, i.e., not contacting either the upper or lower contacts 40 or 41, a conduit 44 connects the upper chamber portion 34A of the chamber 34 with a bleeder valve 45 which is adjusted to permit air leakage from the upper chamber portion 34A to balance the pressure between the upper and lower chamber portions.

Figure 3:
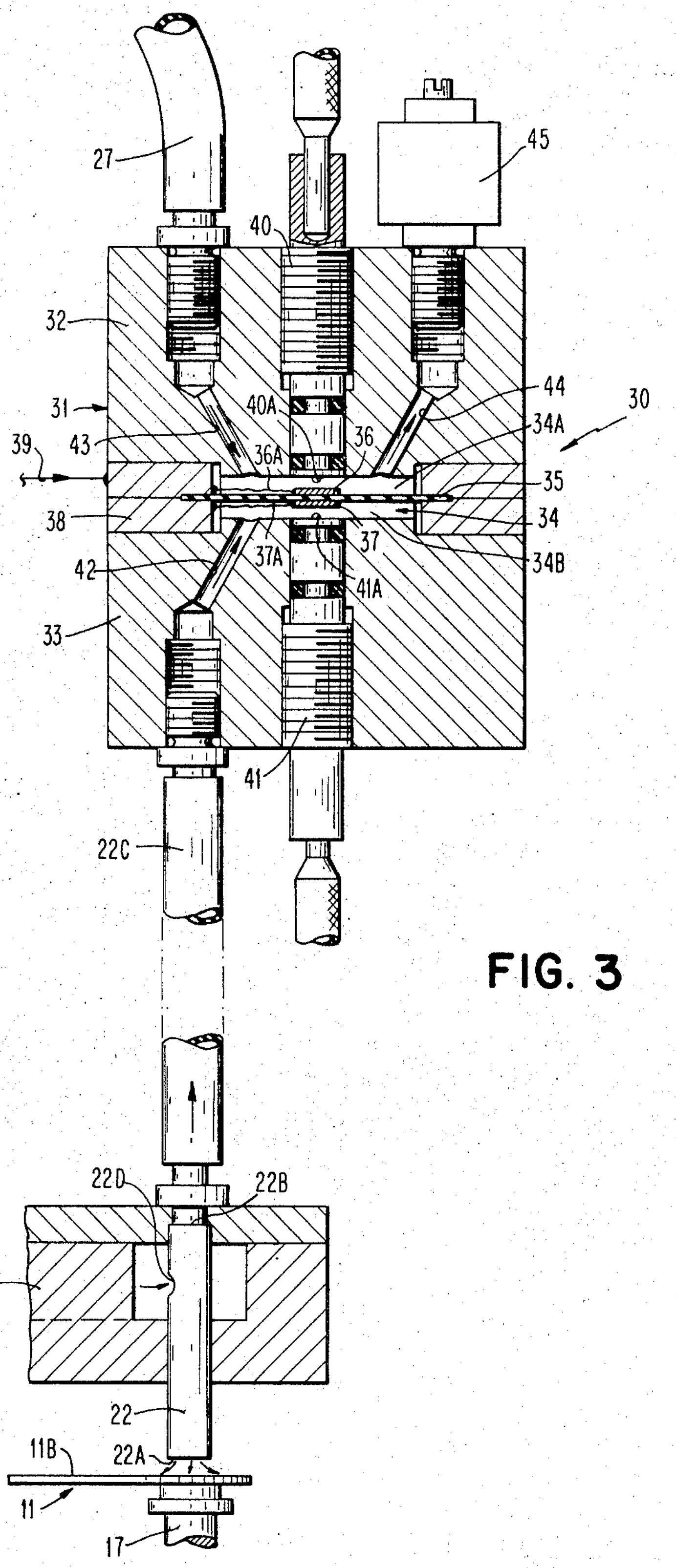
FIG. 3 is an enlarged fragmentary sectional view of a portion of the apparatus illustrated in FIG. 1.

In operation, and assuming that the comparing means has been properly adjusted as by the bleed valve 45 for a desired contour of the wafer at a point immediately beneath the end 22A of each of the tubes 22, if the point on the surface 11B of the wafer is too close to the end of the tube 22A, air escaping from the tube will be impeded causing an increase in the pressure in the lower chamber portion 34B of the chamber 34. This increase in pressure will cause the diaphragm to move until the contact 36 engages the upper contact 40 thereby closing the circuit and causing the actuator, in a manner which will be more fully described hereinafter, to move downwardly thereby increasing the distance between the nozzle end 22A and the surface of the wafer 11B. Alternatively, if the distance from the end of the tube 22 to the surface of the wafer 11B is greater than that desired, the pressure in the lower chamber portion 34B will decrease, and the fixed or predetermined pressure in the chamber 34A will overcome the diaphragm's tendency to remain in the neutral position and the contact 37 will make with the contact 41 thereby closing that circuit. The actuator means will then be energized to effect an elevation of that portion of the wafer 11B underlying the open end 22A of the tube 22, thereby increasing the pressure in the lower chamber 34B until the contact is broken. At that point, the diaphragm will be in the neutral position as illustrated in FIG. 3.

As heretofore described, when the surface 11B of the wafer 11 is not in its proper predetermined position relative to the end 22A of the tube 22, the comparing means 30 operates to effect elevation or retraction of the individual pedestal 17 (wafer retaining means) associated with that particular sensing means. In this connection, a signal from the comparing means serves to drive the actuator means to effect either advancement or retraction of the pedestal according to whether the signal indicates that the pedestal should move in an upward or downward direction. To this end, and referring first to FIG. 1, the actuator means includes a motor, in the present instance a stepping motor 62 having a drive gear 63 on its output shaft, the drive gear serving to effect rotation of a driven gear 64 mounted on a shaft 65 having very fine pitched threads 66 at one end thereof and rotatably mounted in a support strut 67A. Mounted on the finely threaded end of the shaft 65 is a sword cam drive member 67 to which the sword cam 61 is coupled. In this manner energization of the stepping motor 62 effects rotation of the shaft 65 causing the sword cam to advance or retract thereby advancing or retracting the pedestal 17. It should be recognized that each of the actuator means is identical and that there are the same number of actuator means as there are comparing means and sensing means.

Figure 6:
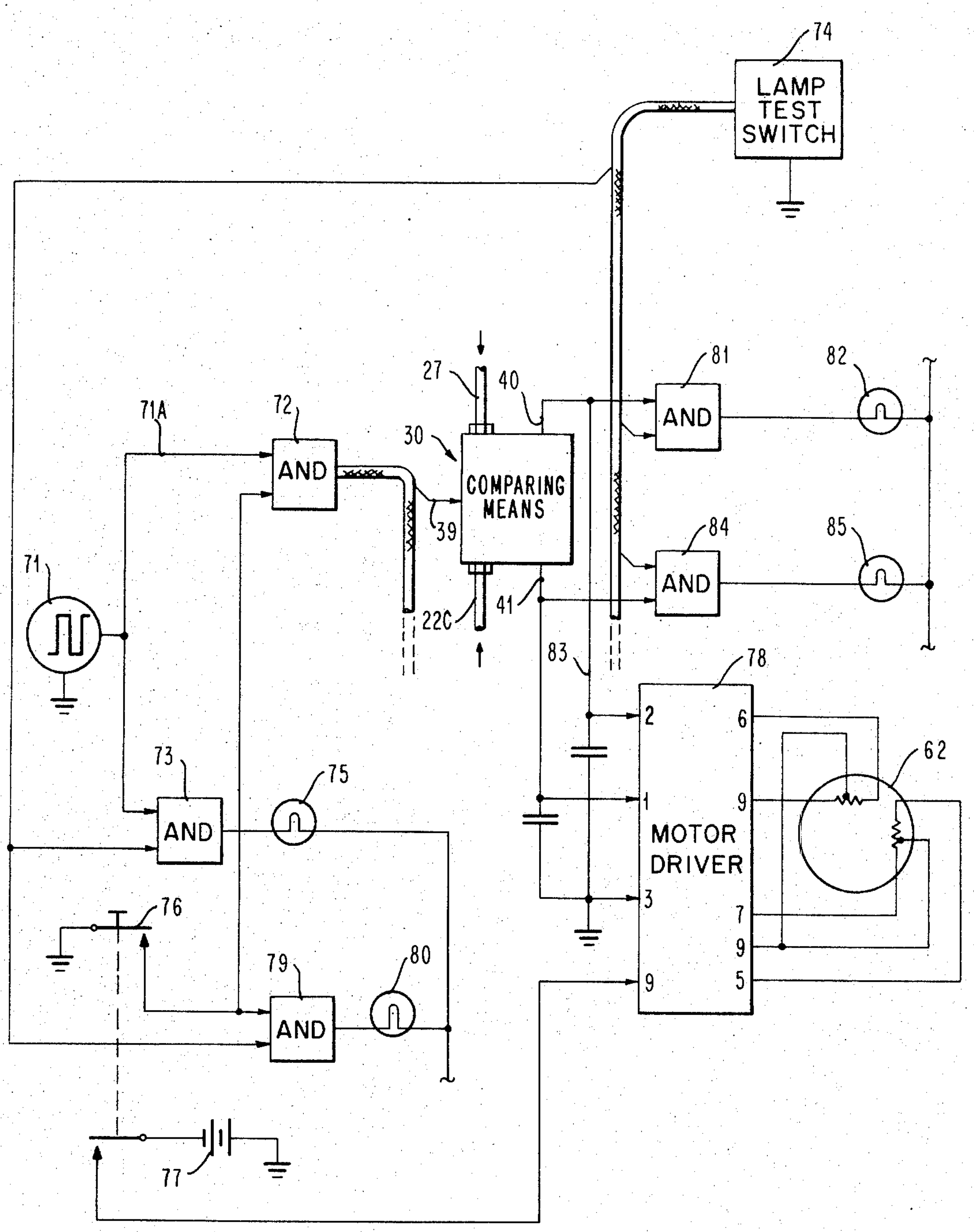
FIG. 6 is a schematic diagram of electrical circuitry which may be utilized in conjunction with the apparatus illustrated in FIGS. 1–5.

The drive for the stepping motor 62 is schematically illustrated in FIG. 6. In this connection an oscillator 71 feeds an input to a first AND gate 72 as through line 71A, as well as driving an input to a second AND gate 73. With the lamp test switch 74 closed, AND gate 73 will conduct causing a lamp 75 to light, the lamp 75 serving to indicate that the oscillator 71 is energized. When the operate switch 76 is closed, power is coupled as through a DC source 77 to a motor driver panel 78. Additionally, closing the switch 76 feeds a second input into AND gate 72 and operates a third AND gate 79, the third AND gate 79 having its second input derived from the lamp test switch 74, effecting lighting of a machine "ON" lamp 80. With the operating switch 76 closed, AND gate 72 will give an output to all of the comparing means 30 as through each input 39 (see FIG. 3). The circuit will then be closed through the comparing means either through contact 40 or 41, as illustrated in FIG. 3, or will be open because the diaphragm 35 is in its neutral position. Assuming a drive condition, with contact 40 energized, a fourth AND gate 81 will be energized causing lamp 82 to indicate that the surface 11B of the wafer 11 is too close to the nozzle end 22A, and therefore, through lead 83, signal the motor driver panel 78 that the stepping motor 62 should effect a retraction of the sword cam 61 permitting the pedestal 17 to be lowered. The signal will continue until the contact 36, because of the reduction of pressure in lower chamber portion 34B, disengages contact 40 thereby disconnecting the drive signal from the motor driver panel and the fourth AND gate 81. The light 82 will then go out.

In a like manner, if the signal is coupled through the lower switch contact 41 in the comparing means 30, a fifth AND gate 84 will receive its second input signal causing lamp 85 to light. Simultaneously, the motor drive panel 78 receives a signal that the surface 11B of the wafer 11 is too far from the end 22A of the tube 22 and the stepping motor will then drive the sword cam inwardly (FIG. 1) to effect an elevation of the pedestal 17 until the pressure equalizes between the upper chamber portion 34A and the lower chamber portion 34B of the comparing means 30. In actual practice the lamps 82 and 85, as well as the AND gates 81 and 84 may be removed and power taken directly through the input 39 associated with each comparing means. The reason for this is that the whole operation of contouring the surface of a 2 ¼ inch silicon wafer to a flat position, takes only one second or less. However, the lamps may be utilized to indicate, with appropriate latching circuitry, whether or not a particular comparing means 30 is in operation and as such provide a suitable test medium for the system.

Conventionally the wafer will be flattened to a surface evenness of approximately 50 microinches. Although lower orders of magnitude may be achieved with the apparatus as disclosed, such is not believed to be necessary with the present state of the art of semiconductor processing.

Figure 4:
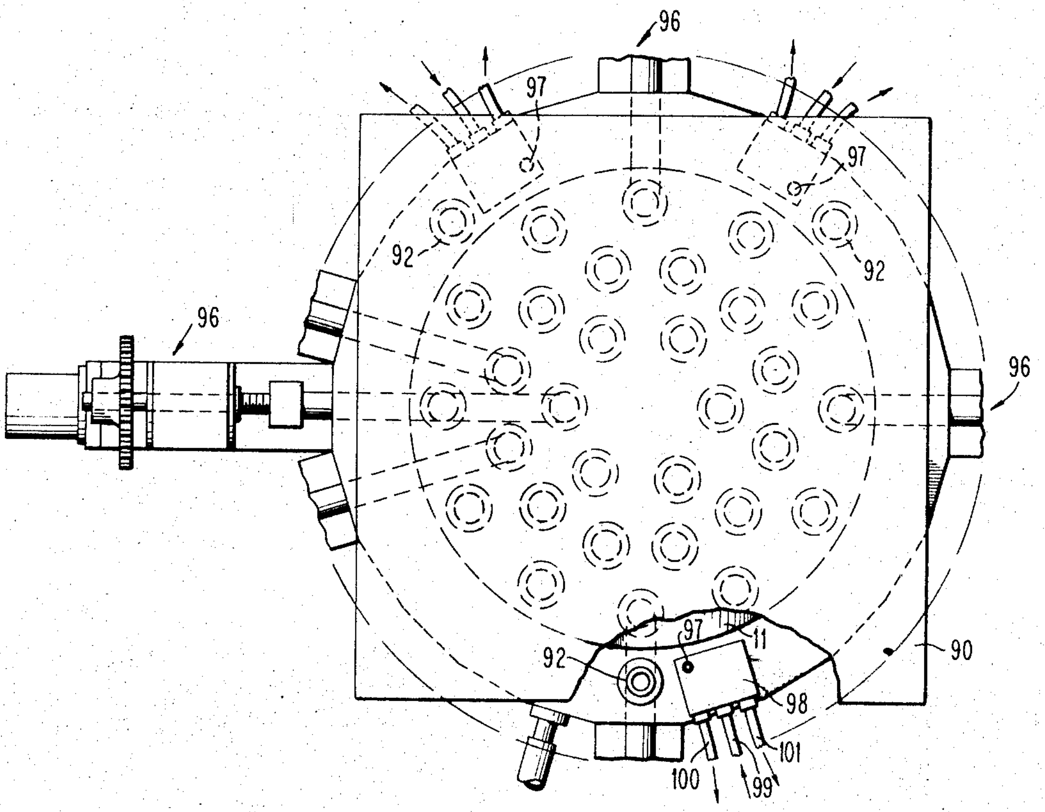
FIG. 4 is a fragmentary plan view of the apparatus illustrated in FIG. 1 and including apparatus for placing a mask in exact position superimposed of the wafer.
Figure 5:
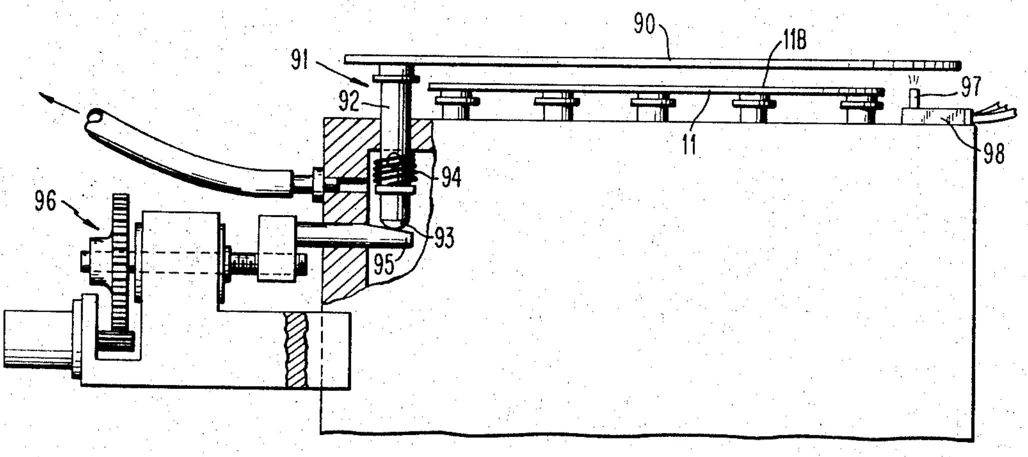
FIG. 5 is a fragmentary side elevational view of the apparatus illustrated in FIG. 4.

After the wafer has been contoured, in the illustrated instance flattened, a mask may be superimposed of the wafer and the pattern on the mask photographed on the wafer. To this end, and referring now to FIGS. 4 and 5, the mask may be positioned so as to contact the wafer without damaging the pattern on the mask, or the mask may be positioned slightly above the surface of the wafer and the image photographed onto the photoresist covered semiconductor wafer. Thus contactless printing may be utilized inasmuch as the distortion due to the unevenness of the wafer is compensated for by the flattening heretofore described relative to the apparatus 10. In this connection, the head 21 is then pivoted away from the wafer so that a mask may be positioned superimposed of the surface 11B of the wafer 11. In order to insure that the lower surface of a mask, such as the glass mask 90 illustrated in FIGS. 4 and 5, is parallel to the wafer 11, a three point pedestal system identical to the wafer retaining means may be utilized to support the mask superimposed of the wafer.

As illustrated, the mask retaining means 91 include three pedestals 92 which are actuated and biased and connected to the mask in the same manner as heretofore described with respect to the pedestal 17, and the actuator means 60. In the illustrated instance, the mask retaining means includes a pedestal 92, a lower rounded camming surface 93 and a biasing spring 94 which tends to cause the pedestal to be pushed downwardly against a sword cam 95 associated with actuator mechanism 96. Similarly, the sensing means may comprise nozzles or tubes 97 which underlie the mask 90 and permit detection of the proximity of the lower surface of the mask to the end of the nozzle. As illustrated, the sensing means includes a manifold 98 having an inlet 99, and a connection 100 to a comparing means identical to that illustrated in FIG. 3 and described above. Additionally, the manifold 98 includes a second outlet 101 which is connected to the opposite side of the comparing means. Thus the mask 90 may be levelled and achieve a plane parallel to the surface 11B of the wafer, the mask being placed in direct contact with the wafer, or spaced from but adjacent thereto.

After the photoresist on the surface 11B of the wafer 11 has been exposed, the mask and wafer may be removed and a new wafer placed on top of the wafer retaining means and the head 21 pivoted until the sensing means 20 overlies the wafer.

It should be recognized that the initial setup of the machine, so that the ends 22A of the tubes 22 overlying the pedestals or wafer retaining means, is critical to correct operation. This may be accomplished by the use of test specimens having a known surface waviness, an interferometer, and by adjusting the bleed valves 45 associated with the upper chamber portion 34A of the chamber 34. It should also be recognized that the method and apparatus of the present invention may be employed to set a specific contour on thin flat elements so as to compensate, for example, for lens aberration or defects in projection type printing systems.

In summary, a semiconductor wafer is supported from the back side by a two dimensional array of suction cups. The topography of the resist-coated front or upper surface is measured by a corresponding array of sensors superimposed and spaced from the upper surface of the wafer. As heretofore described in the example given above, a flat surface will cause the same signal at the output of each individual sensor. Signals of different magnitudes will arise due to an irregular or wavy surface which will activate the stepping motors in combination with gear reduction and cam systems. Each of these, in turn, will raise or lower its associated suction cup until all subregions of the surface have been displaced such that the entire surface is within the specified setup tolerance. Generally, the machine setup will be within the residual permissable waviness or surface deviation of the resist coated surface, the residual permissible waviness being generally referred to as the "resolution limit." The resolution limit is equal to the tolerable line width error and/or registration error which may result from such deviation. Thus the method and apparatus of the present invention permits contouring, including flattening of a wafer within very close tolerances thereby overcoming the problems inherent with projection or contact printing heretofore encountered in the prior art.

Although the invention has been described with a certain degree of particularity, it is understood that the present disclosure has been made only by way of example and that numerous changes in the details of construction, the combination and arrangement of parts, and the method of operation may be made without departing from the spirit and the scope of the invention as hereinafter claimed.

What is claimed is:

1. Apparatus for contouring a surface of a wafer, said apparatus comprising: a plurality of individual retaining means for gripping, at selected places, a surface of said wafer; a plurality of sensing means spaced from said retaining means for sensing the contour of the surface of said wafer opposite to the surface being gripped by said retaining means; comparing means responsive to said sensing means for comparing a desired contour with the contour of said wafer surface facing said sensing means; and actuator means connected to said retaining means for elevating and retracting selected ones of said retaining means when said comparing means indicates a difference between said desired contour and the contour of said wafer surface.

2. Apparatus in accordance with claim 1 wherein said individual retaining means comprises suction cups, and means for applying a vacuum to said suction cups.

3. Apparatus in accordance with claim 1, wherein each of said sensing means comprises a tube having an open end adjacent to, superimposed of and aligned with respective ones of said retaining means.

4. Apparatus in accordance with claim 1 wherein each of said sensing means comprises a tube having a first open end superimposed of said retaining means, and a second open end connected to said comparing means; and means for supplying a gaseous medium to said tube.

5. Apparatus in accordance with claim 4 wherein each of said comparing means includes a housing having a chamber therein, a diaphragm in said housing dividing said chamber into first and second chamber portions, and means for applying said gaseous medium supplied to said tube to said first chamber portion, and means for applying the gaseous medium from said second open end of said tube to said second chamber portion.

6. Apparatus in accordance with claim 5 including bleeder means in said first chamber portion for balancing the pressure in said first chamber portion relative to the pressure in said second chamber portion when said first open end of said tube is a predetermined distance from said opposite surface of said wafer.

7. Apparatus in accordance with claim 5 including first and second contact means on opposite sides of said diaphragm, and first means on said diaphragm for contacting the first of said contact means when the pressure in said second chamber is greater than the pressure in said first chamber, and second means on said diaphragm for contacting the second of said contact means when the pressure in said first chamber is greater than the pressure in said second chamber.

8. Apparatus in accordance with claim 7 wherein said actuator means includes drive means connected to said retaining means, and means connecting said first and second contact means to said drive means; power supply means connected to said first and second means on said diaphragm, and means to effect movement of said drive means in a first direction when said first contact connects said first means on said diaphragm and in a second direction when said second contact connects the second means on said diaphragm.

9. Apparatus in accordance with claim 1 wherein said retaining means comprises a pedestal, and said actuator means includes drive means connected to said pedestal; means connecting said comparing means to said drive means, and power supply means to effect movement of said drive means in opposite directions.

10. Apparatus in accordance with claim 9 wherein said drive means includes a stepping motor, and cam means connected to said stepping motor and in engagement with said pedestal to effect reciprocation of said pedestal.

11. Apparatus for contouring a surface of a wafer, said apparatus comprising: means to grip a first surface of said wafer, means to sense the topography of a second surface of said wafer; means to manipulate said first surface of said wafer, and means interconnecting said sensing means and said manipulating means to effect contouring of said second surface in accordance with the topography sensed.

12. Apparatus in accordance with claim 11 including comparing means intermediate said sensing means and said manipulating means, and means in said comparing means to compare the topography sensed with a predetermined topography, and to actuate said manipulating means to distort said first surface of said wafer until the topography of said second surface is substantially the same as the predetermined topography.

13. Apparatus in accordance with claim 11 wherein said means to grip said first surface comprises a plurality of suction cups.

14. Apparatus in accordance with claim 11 wherein said sensing means comprises a plurality of spaced apart tubes each having an end adjacent to and superimposed of said second surface of said wafer.

15. Apparatus in accordance with claim 14 including means associated with said tubes for detecting the distance from the ends of said tubes to the underlying portion of the second surface of said wafer.

16. A method of contouring the surface of a semiconductor wafer, said method comprising the steps of: grasping one surface of said wafer at a plurality of places therealong; sensing the opposite surface of said wafer to determine the contour thereof; comparing the sensed surface contour with a desired contour; adjusting the first mentioned surface until said contour of said opposite wafer surface is substantially the same as the desired contour.

17. A method in accordance with claim 16, including the step of: superimposing a mask adjacent said opposite wafer surface, and positioning said mask to achieve substantial parallelism between said opposite wafer surface and one surface of said mask.

18. A method in accordance with claim 17, including the step of: contacting said opposite surface of said wafer with said mask.

19. A method in accordance with claim 17, including the step of: spacing said mask from said wafer but closely adjacent thereto.

20. A method in accordance with claim 17 wherein said semiconductor wafer includes a layer of photoresist on said opposite surface of said wafer, and including the step of exposing said photoresist through said mask.

* * * * *